United States Patent [19]

Penz

[11] 4,224,615
[45] Sep. 23, 1980

[54] METHOD OF USING A LIQUID CRYSTAL DISPLAY DEVICE AS A DATA INPUT DEVICE

[75] Inventor: Perry A. Penz, Richardson, Tex.

[73] Assignee: Texas Instruments Incorporated, Dallas, Tex.

[21] Appl. No.: 942,226

[22] Filed: Sep. 14, 1978

[51] Int. Cl.³ .................. G02F 1/13; G06K 15/18
[52] U.S. Cl. .................. 340/712; 340/365 C; 340/765; 340/784; 350/334
[58] Field of Search .................. 340/365 C, 712; 350/334

[56] References Cited

U.S. PATENT DOCUMENTS

| | | | |
|---|---|---|---|
| 3,772,685 | 11/1973 | Masi | 340/365 C |
| 3,846,791 | 11/1974 | Foster | 340/365 C |
| 4,017,848 | 4/1977 | Tannas | 340/712 X |
| 4,078,257 | 3/1978 | Bagley | 340/712 X |

*Primary Examiner*—David L. Trafton
*Attorney, Agent, or Firm*—William E. Hiller; Melvin Sharp; James T. Comfort

[57] ABSTRACT

A liquid crystal display (LCD) device may be used as a device for receiving data from a human operator, that is, an LCD device may be used as a keyboard for receiving data from a human operator. The LCD device preferably has a rear substrate, a transparent front plate, a plurality of segments formed on the substrate and on the plate, liquid crystal material disposed between the cover and the substrate and the plate, and means for sealing the liquid crystal material between the substrate and the plate. The front plate material, which may be glass, plastic or other transparent materials, has sufficient flexibility to deflect toward the substrate in response to the application of pressure by the human operator. The application of pressure occurs, for instance, when the human operator depresses selected areas of the LCD device in much the same manner as when a human operator applies pressure to a keyboard to input information. Selected segments of the LCD device are preferably actuated to define one or more areas on the device where the operator may input information and the segments disposed in the regions of the one or more areas are sensed for a change in capacitance between the segments disposed on the substrate and the segments disposed on the front plate, the change in capacitance occurring when the operator applies pressure to the plate and deflects it toward the substrate.

13 Claims, 8 Drawing Figures

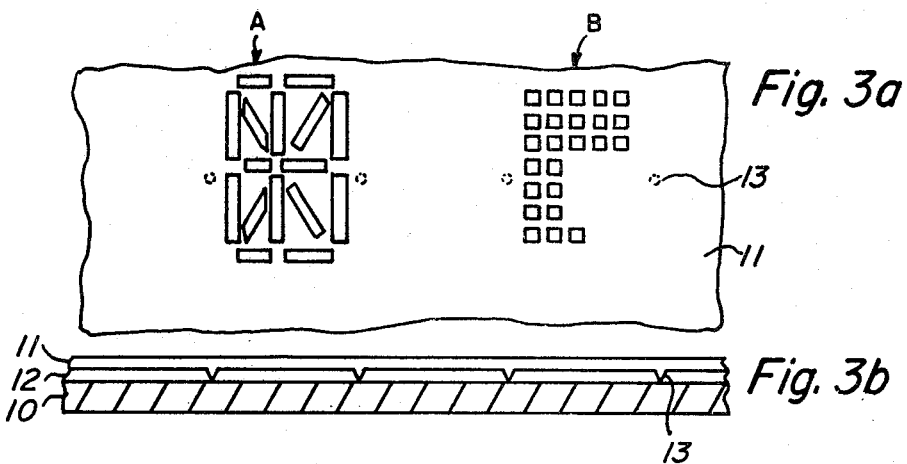
Fig. 3a
Fig. 3b
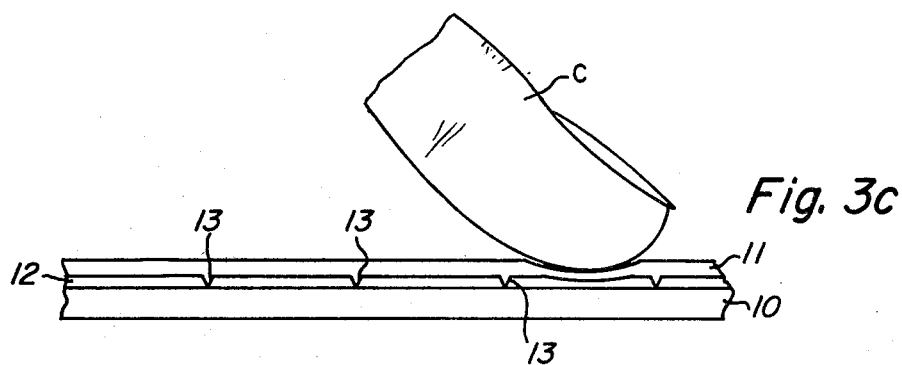
Fig. 3c
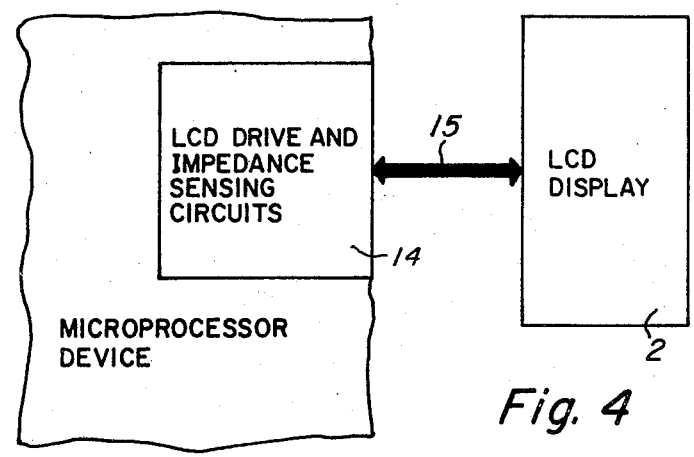
Fig. 4

METHOD OF USING A LIQUID CRYSTAL DISPLAY DEVICE AS A DATA INPUT DEVICE

BACKGROUND OF THE INVENTION

This invention relates to liquid crystal display (LCD) devices and means for receiving data from a human operator, such as keyboards, and more particularly to a liquid crystal display device which may be used for receiving information from a human operator as well as displaying information.

LCD's are very well known in the art and are frequently used as display devices for displaying information outputted from a calculator, a watch, appliances, or other electronic apparatus. The LCD devices have undergone considerable improvement in the last several years and are presently used in many applications; LCD's are particularly well suited for use with portable, battery-powered electronic apparatuses, such as calculators and watches, because LCD's require very little power to display information in these battery-powered apparatuses. It should be appreciated, however, that the instant invention may be used, if desired, in any application using LCD's to display information.

The electronic appliances and apparatuses which utilize LCD's often frequently include a keyboard, that is, an array of key switches or push buttons, or other types of electrical switches and contacts to input information to the appliance or apparatus. In the embodiment of a calculator, for example, the keyboard may include ten numeral keys, a decimal point key, and five or more function keys (plus, minus, multiply, divide and equals). Further, those familiar with the calculator art will realize that as the complexity of the calculator increases, the number of functions which the calculator may accomplish likewise increases. Of course, given the small size of these hand-held calculators and the size of the human finger, there is a practical limit on the number of keys which may be provided on a calculator or other such electronic device to access the functions which it may perform. Of course, other small appliances may benefit from having additional keys. Additionally, having the capability to program the functions which the keys perform can greatly increase the flexibility of the calculator or other appliances.

It was therefore, one object of this invention that a combination display device and keyboard device be provided for an electronic calculator or other electronic apparatus. It was another object of this invention that a liquid crystal display device be adapted for receiving inputs from a human operator in addition to displaying information to the human operator. It was yet another object that the number of keys presented to the operator be selectable. It was still yet another object that the legends associated with the keys be selectable.

The foregoing objects are achieved as is now described. A LCD device having a rear substrate, a transparent front plate, a plurality of segments formed on the substrate and on the plate, and a liquid crystal material disposed between the substrate and plate is provided with a plate which will deflect toward the substrate in response to the application of pressure by a human operator. The segments of the LCD device are actuated by conventional means to output information to the operator. This information will include selected segments which are actuated to define one or more regions on the device where the operator may depress the front plate to input information to the apparatus to which the LCD is coupled. The segments in these one or more regions are sensed for a change in capacitance between the segments mounted upon the substrate and the segments mounted upon the front plate within these regions. The change in capacitance occurs when the operator depresses the cover thereby increasing the capacitance imposed by the liquid crystal material between opposing segments. By appropriating energizing and sensing the segments of the LCD device, the number of regions (that is, the number of keys) is selectable as are the legends displayed in conjunction with these regions.

BRIEF DESCRIPTION OF THE FIGURES

The novel features believed characteristic of the invention are set forth in the appended claims. The invention itself, however, as well as further objects and advantages thereof, will be best understood by reference to the following detailed description of an illustrative embodiment, when read in conjunction with the drawings, wherein:

FIGS. 1 and 2 are plan views of a calculator embodying the present invention;

FIG. 3a is a top plan view of a portion of a liquid crystal display (LCD) device;

FIG. 3b is a side sectional view of an LCD display during its normal mode of operation;

FIG. 3c is a side sectional view of an LCD display which is being depressed by a human operator;

FIG. 4 is a block diagram of the LCD drive and impedance sensing circuits and the LCD display device;

DETAILED DESCRIPTION

Figures 1, 2:
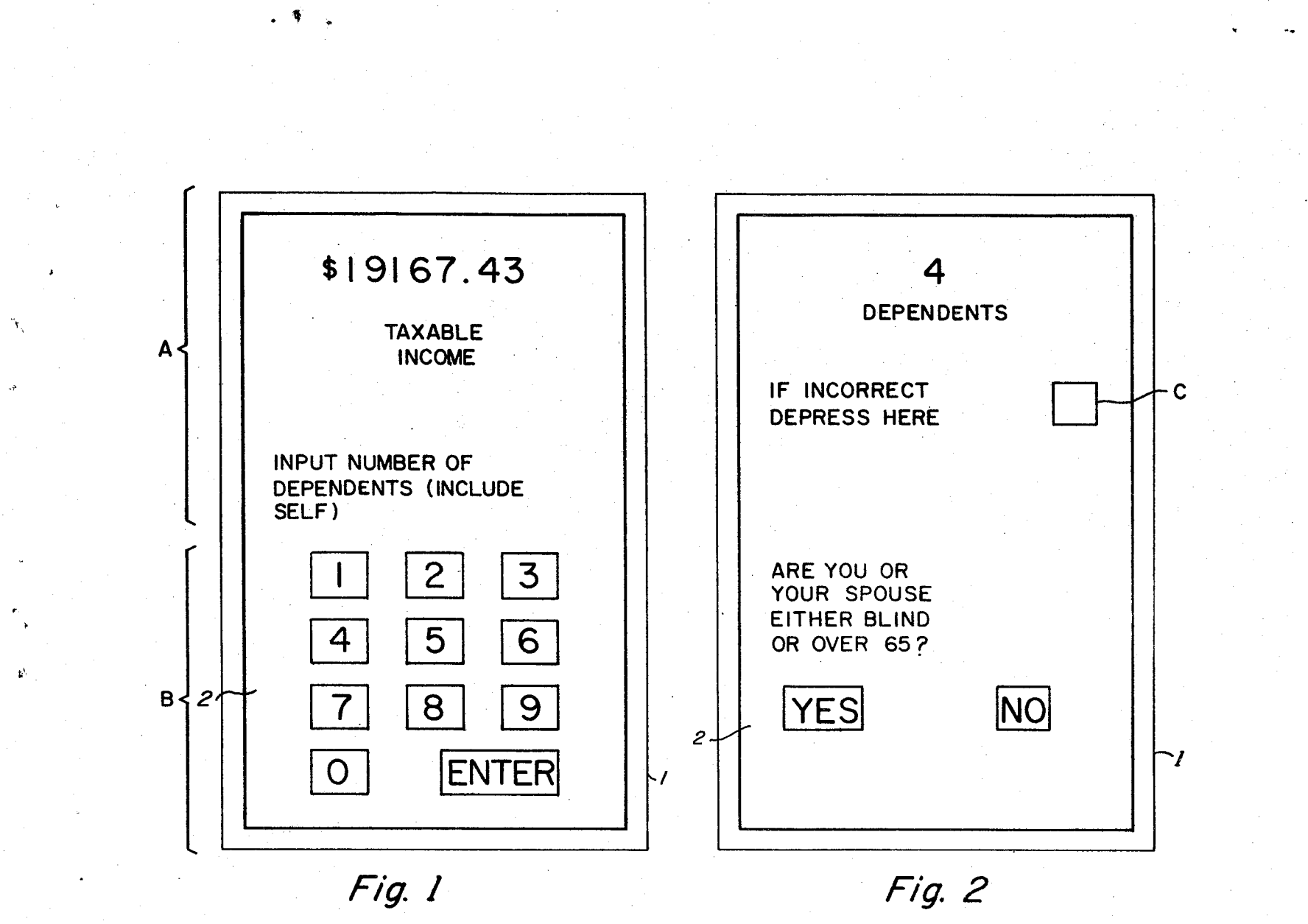
Figure 5:
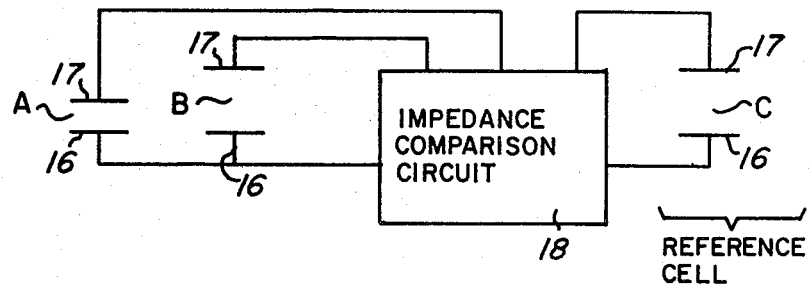
FIG. 5 is a block diagram of an impedance comparison circuit.

Referring now to FIG. 1, there is shown an electronic calculator or computer which utilizes the present invention. The electronic calculator or computer is housed in a housing 1 which includes a liquid crystal display device 2. In this embodiment, display device 2 has a surface area nearly as large as the top portion of housing 1. Those skilled in the art will recognize that LCD device 2 shown in FIG. 1 is generally larger than that which is commonly available. However, while larger and larger area LCD devices are becoming commercially available, those skilled in the art will also recognize that the present invention may be utilized with any size of LCD display device. The present invention is particularly useful, however, for use with LCD devices having an area larger than, for instance, the area of a keyboard having ten to fifty or more push buttons when the present invention is used with a calculator or a computer, for instance. In the embodiment of a calculator or computer, the LCD device is preferably at least as large as a keyboard having ten or more keys since, as will be seen, the LCD device serves as a keyboard in addition to serving as a display.

It must be appreciated, moreover, that the present invention is here illustrated in conjunction with a calculator/computer for purposes of illustration only. The LCD display systems employing the present invention may be used in many other applications, including telephones, televisions and other communication equipment, kitchen appliances, such as microwave oven, and a wealth of other applications.

In FIG. 1, LCD display 2 is shown with information being displayed thereat at reference A and additional information being displayed at reference B. Additionally, at reference numeral B, selected areas of LCD display 2 are sensitized to the touch by a human operator for inputting information. In this particular embodiment, the calculator or computer is shown somewhere in the middle of an income tax program wherein the operator's taxable income has just been computed and is being displayed in the reference A portion of the display. In addition, the reference A portion displays a legend calling for the inputting of the number of dependents being claimed by the taxpayer. In the reference B portion of LCD display 2, there is being displayed a representation of a ten digit keyboard with an "enter" key. At this point the operator is being instructed to input the number of dependents (including self), and the operator will respond by depressing LCD display 2 at the appropriate numerals and at the "enter" legend. As will be seen, depressing display 2 causes a change in the capacitance between opposing segments of the display 2. This permits the sensing of the change in capacitance between selected segments of the display (1) to indicate whether or not the operator is inputting information at the LCD display 2 and (2) if the operator is inputting information, to identify the inputted information.

It is to be appreciated, of course, that the calculator or computer may be provided with any one of a number of different programs or may include hard-wired, predetermined functions. Also, as will be seen, the particular areas which are sensitized to the touch of a human operator may be selected, as desired, thereby permitting any desired figuration of a keyboard or data inputting device, the configuration merely being limited by size and design of the LCD display 2. Additionally, the legends used in conjunction with the keys may be altered, that is modified while the calculator or computer is being used.

Assuming, for the time, that the computer or calculator does include the aformentioned income tax program and assuming the operator depresses the numeral "4" and then the "enter" legend when the LCD was showing the display of FIG. 1, the calculator or computer is preferably designed or programmed to respond by showing a display such as that shown in FIG. 2, for instance.

Referring now to FIG. 2, there is again shown the calculator or computer of FIG. 1, but at the next display sequence in the income tax program. Now the number of dependents is being shown. If the human operator made an error in entering the number of dependents, he or she is given the opportunity to depress a selected portion of the display (at reference C) causing the calculator or computer to give the operator another opportunity to input the number of correct dependents, by reverting to the display shown in FIG. 1, for instance. Assuming the correct number of dependents has been inputted, the operator is next asked in this embodiment whether or not the operator or his or her spouse is either blind or over 65, which, of course, under present income tax laws, affects the amount of tax owed.

As can be easily seen by comparing FIG. 1 and FIG. 2, the keyboard areas, that is, the areas of the LCD which respond to depressions thereof by the operator of the device may be selectively altered. Thus, any given area of the display may preferably be used to output data or information at one time and to receive data at some other time. The foregoing income tax program demonstration shows the tremendous flexibility which results from use of the instant invention thereby permitting different portions of LCD device 2 to serve as a data inputting device at different times in a program. Of course, the disclosed LCD device may be used with other programs and in other types of equipment, as well as that described here.

Referring now to FIGS. 3a–3b, there are shown a top plan view and a side sectional view of a conventional LCD device. In the side sectional view of FIG. 3b, the LCD display includes a rear substrate 10 and a front substrate 11 with a liquid crystal material 12 being sandwiched therebetween. The liquid crystal material 12 is sealed in the space between substrates 10 and 11 by conventional sealing means, not shown here for simplicity's sake. Protuberances 13 on front substrate 11 may be used, if desired, to help assure a proper spacing between the front and rear substrates is maintained. In FIG. 3a, two different arrangements of character forming electrodes are shown at references A and B. At reference A, there is shown the well known sixteen segment "British Flag" arrangement of segments while at reference B there is shown a 5×7 dot matrix of segments. Of course, for each of strobing the LCD, usually only one such arrangement (or some other arrangement) repeats itself over the area of the LCD. However, different arrangements could of course be used in the same LCD at the same time, if desired. Other arrangements of the character forming electrodes are either known or will be readily apparent to those skilled in the art.

The character forming segments are typically disposed on either one or both of the substrates 10 and 11 on the side thereof which contacts liquid display material 12. The segments may be formed either on both substrates 10 and 11 or alternatively one of the substrates 10 or 11 in which case a common electrode is then disposed on the other substrate. A display arrangement showing segmented electrodes on both substrates is shown in U.S. patent application Ser. No. 799,807 filed May 23, 1977 and an arrangement showing segmented electrodes on one substrate and a common electrode on the other substrate is shown in U.S. Pat. No. 4,005,403. The character forming segments are preferably formed by depositing a transparent conductor, such as tin oxide, on the surface of the substrates 10 and 11.

In the embodiment shown in FIGS. 3a–3b, substrate 11 is the substrate through which the operator views the segments which are being actuated. Thus, substrate 11 is preferably formed of glass or other transparent material. Substrate 10 may or may not be formed of a light transmissive material but generally is provided with a reflective surface at either the front or rear side thereof which reflects light back through substrate 11. Not shown in FIGS. 3b and 3c, for sake of clarity, are polarizers which may be used when the liquid crystal material 12 is of the twisted nematic type. The spacing between substrates 10 and 11 is generally closely maintained in the LCD art to assure proper actuation of the display. The separation between the substrates depends upon the particular liquid crystal material utilized and the voltage levels used to strobe the segment electrodes; however, separations on the order of 5 to 10 microns are known and actuation voltages as low as three to four volts are known. Various direct and multiplexed drive schemes are known for actuating the display. Exemplary drive schemes are described in U.S. patent application Ser. No. 799,807, filed May 23, 1977. As is well known to those in the art, coupling appropriate voltage potentials to appropriate opposing segments (on substrates 10 and 11) sets up electrical fields between these segments which induce a change in the liquid crystal material, which change is manifested by a change in display contrast levels at these segments.

In FIG. 3c, there is shown a portion of a human finger at reference C depressing a portion of substrate 11 toward substrate 10. As aforementioned, character forming segments are formed on one or both of the inside surfaces of substrates 10 and 11 facing liquid crystal material 12. As can be seen from FIG. 3c, in the area which the operator's finger applies pressure to substrate 11, the spacing between substrates 10 and 11 decreases, because substrate 11 has sufficient flexibility to deflect under the slight pressure applied by a human to a typical key-board. I have found that using glass having a thickness on the order of 10 mils provides excellent flexibility and thus excellent results. However, it should be apparent to those skilled in the art that other flexible materials, such as many plastics, also exhibit sufficient flexibility to permit substrate 11 to deflect toward substrate 10 upon the application of a small amount of pressure by a human operator. The amount of deflection is exaggerated in FIG. 3c for ease of illustration. As long as the deflection reduces the spacing between the front and rear substrate by 10 to 20 percent, the impedance measuring circuit can easily detect the depression. Thus, assuming a normal spacing of 10 microns, the thin flexible substrate need only locally deflect 1 to 2 microns.

Preferably, rear substrate 10 is sufficiently rigid so that it does not deflect in parallel with front substrate 11 when the human operator depresses the front substrate. This may be accomplished by (1) appropriate choice of materials (2) using a thicker rear substrate or (3) supporting rear substrate 10 (for instance, a portion of calculator case 1 could be used, if desired, to support rear substrate 10).

Those skilled in the art will appreciate that an LCD device performs better if the spacing between substrates 10 and 11 remains essentially constant during normal operations. This may be accomplished, for example, by the addition of protuberances 13 from one of the substrates (here shown from substrate 11). It has been found that such protuberances (which have an essentially uniform height) help to assure that the normal spacing between substrates 10 and 11 remains essentially constant and thus the spacing between the electrodes formed on substrate 11 and the electrodes formed on substrate 10 likewise remains essentially constant during normal operation. However, in the area in which the operator's finger causes deflection of substrate 11 toward substrate 10, the spacing between the segments formed on substrate 11 and the segments formed on substrate 10 is decreased. Thus, the spacing between adjacent protuberances 13 (if used) is preferably selected to permit localized deflection of substrate 10 under the application of pressure by a human's finger. In the embodiment shown in FIGS. 3a and 3c, the protuberances 13 have been located between adjacent character positions. The decrease in spacing between opposing segment electrodes may be measured in external LCD drive circuits by sensing the impedance of the liquid crystal material. I have found that the mechanical motion of depressing substrate 11 will compress the liquid crystal material and, in general, cause a reorientation of the liquid crystal material at the point of contact.

The reduced spacing causes the aforementioned impedance change, which may be detected by the computer, calculator or other appliance or circuit used to drive the LCD device. LCD drive and impedence sensing circuits 14 are shown interconnected with LCD device to via bus 15 in FIG. 4.

I have previously mentioned that the impedance between opposing segments changes with depression of substrate 11 by the operator's finger, which change in impedance may be measured by impedance sensing circuits coupled to LCD device 2. Referring now to FIG. 5, there is shown, in block diagram form, an impedance comparison circuit 18 which is coupled to opposing segments 16 and 17 formed on substrates 10 and 11, respectively. As can be seen, segments 16 and 17 are more closely spaced at reference A than they are at either reference B or reference C. The narrow spacing occurs (at reference A) in response to the depression of substrate 11 by the human operator whereas the wider spacing at references B and C is the normal spacing in the areas of an LCD display which are not being depressed by a human operator. The opposing segments at references A and B represent two of the opposing segments on the front and rear substrates of the LCD device of FIG. 3a. Of course, the LCD device has 35 segments per character position (assuming 5×7 dot matrices are used—for instance) and a plurality of character positions. Therefore, the impedance comparison circuit 18 is preferably selectively coupled to a plurality of similar opposing segment pairs such as those depicted at references A and B. Only two such opposing segment pairs are shown at references A and B, merely for sake of clarity. The opposing segment pair at reference C is preferably a standard cell in the area of the display which preferably is not or cannot be depressed, thereby permitting the impedence comparison circuit to selectively compare first cell A with cell C and then cell B with cell C and so forth for the various cells of the LCD display. Of course, the comparison could also be made against a capacitance of predetermined value. A specific impedance comparison circuit is not shown here; however, such should be well within the skill of a person skilled in the art of driving LCD devices. Of course, it is the matter of design choice whether those practicing the present invention decide to test the impedance of one, some or all of the opposing segment pairs making up a character position to be tested for the inputting of data. This occurs because the character electrodes position formed by a set of segments, such as those shown at references A or B in FIG. 3a, are conventionally on the order of the size of the tip of a human finger; thus, it is not necessary to test, in most embodiments, all of the cells formed by opposing segments in the area of the display to be tested, with the aforementioned reference cell. Furthermore, certain cells or opposing segment pairs in the area to be tested with the reference cell may be actuated for the display of information. This occurs, for example, in the keyboard area of FIG. 1 where the numerals are being displayed by appropriate actuation of selected segments. The dielectric constant of the liquid crystal material changes by a factor of two or so with actuation, therefore, it is preferable that the cells which are selected for comparison with the reference cell be unactuated cells (assuming, of course that the reference cell is likewise unactuated, however, if the reference cell were being actuated, then the comparison would preferably be made with actuated cells). This may be easily accomplished as will now be explained.

Assuming that the display utilizes a plurality 5×7 dot matrices, and assuming that the dots aligned in columns on one substrate are connected in common and assuming that the dots arranged in rows on the other substrate are similarly connected in common, selected cells of the display may be actuated by appropriately strobing the rows of cells on one substrate and, at the same time, strobing selected columns of cells on the other substrate. This results in a 1/7th duty cycle for each actuated cell. Of course, the selective strobing of the columns of cells is preferably controlled by a thirty-five bit code stored for each possible character in a character ROM, such as ROM 20 in FIG. 6. The thirty-five bit code for each displayable character will typically include a series of ones and zeroes indicating whether or not the thirty-five cells in any given 5×7 dot matrix LCD character position are to be actuated. Thus, the selection of unactuated (or actuated) cells for comparison with the reference cell may be easily accomplished by examining the thirty-five bit code for each character position to be sensed.

It will also be appreciated by those skilled in the art, that using a 5×7 dot matrix strobed as aforementioned, yields a character position requiring twelve conductors (five column conductors and seven row conductors). Each additional character position, of course, requires five additional conductors for the five columns of cells in each character position, assuming the column conductors are connected in common for similarly situated columns of dots in each character position. Thus, if the entire LCD device has, for purposes of illustration, two hundred character positions, then more than one thousand conductors would typically be used in bus 15 to interconnect the LCD drive and sensing circuits with LCD display 2. One way of reducing this large number of interconnections is by incorporating a data memory, drivers and the impedance test circuit 18 onto the same substrate 10 on which LCD device 2 is formed. This may be accomplished, for example, if LCD device 2 utilizes a silicon substrate 10, such as that which is described in U.S. Pat. No. 3,765,747, by J. M. Pankrantz and K. E. Bean which issued Oct. 16, 1973. U.S. Pat. No. 3,765,747 is hereby incorporated herein by reference. Then, the aforementioned memory, drivers and impedance test circuit may be integrated into the same silicon substrate if desired.

Figure 6:
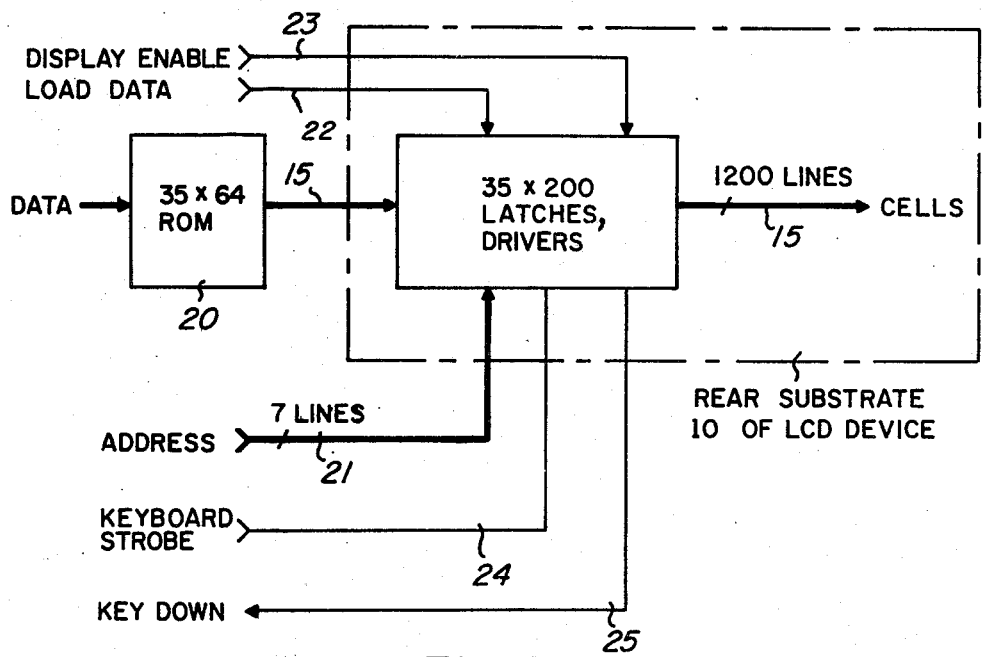
FIG. 6 is a simplified schematic diagram of a LCD device utilizing a silicon substrate.

Referring now to FIG. 6, there is a shown a simplified schematic diagram of such an LCD device and strobing circuitry. Here, the data is applied to a 35×64 bit ROM 20 which stores up to sixty-four different 35 bit character codes (of course, the number of different characters is a design choice, just as the number of bits used to represent each character is a design choice). The 35 bits for each character code is shown here being supplied in parallel (although either a serial arrangement or integrating ROM 20 on the aforementioned silicon substrate may be used to further reduce interconnect) for loading into the data memory or latches at a location defined by a character position address on bus 21 and under control of a load control line 22. The display is actuated by a signal on line 23 enabling the data memory to drive the drivers which in turn strobe the cells in displaying that which is stored in the memory. Thereafter, addresses may be applied on lines 21 in combination with a keyboard strobe on line 24 to test for depression of the display at the character position specified by the address on bus 21. The results of the test would be indicated by a key-down signal, for example, on line 25 in this embodiment. As can be clearly seen, the number of conductors needed to interconnect the microprocessor device or other data processing device with LCD display 2 has been significantly reduced.

Having described my invention in connection with several embodiments thereof, other embodiments will be readily apparent to those skilled in the art. It is intended that my invention is not to be limited to the embodiments described except as specifically set forth in the appended claims.

What is claimed is:

1. A method of inputting information to a liquid crystal display device, said device having a plurality of segments suitable for outputting information and a flexible front substrate, said method comprising:
   activating selected segments of the liquid crystal display device to define selected areas where a human operator may input information to the liquid crystal display device by depressing the flexible front substrate thereof;
   inputting information to the liquid crystal display device by selectively depressing a portion of the flexible front substrate associated with a particular activated selected area to change the impedance between at least one segment pair in the particular activated selected area corresponding to the depressed portion of the flexible front substrate;
   sensing the impedance between at least one segment pair in each of the activated selected areas; and
   determining the particular activated selected area corresponding to the portion of the flexible front substrate as selectively depressed by sensing an impedance change between at least one segment pair in the particular activated selected area corresponding to the depressed portion of the flexible front substrate.

2. A method of inputting information to a liquid crystal display device, wherein said liquid crystal display device includes a plurality of segments suitable for outputting information, a body of liquid crystal material to which the plurality of segments are exposed, and a flexible front substrate overlying the body of liquid crystal material, said method comprising:
   inputting information to the liquid crystal display device by selectively depressing a portion of the flexible front substrate against the body of liquid crystal material for changing the impedance between at least one segment pair in the area corresponding to the depressed portion of the flexible front substrate.

3. A method as set forth in claim 2, further including sensing the impedance between a plurality of segment pairs in respective areas of the liquid crystal display device; and
   determining the particular selected area corresponding to the portion of the flexible front substrate as selectively depressed by sensing an impedance change between at least one segment pair in the particular area corresponding to the depressed portion of the flexible front substrate.

4. A method as set forth in claim 3, further including initially activating selected segments of the liquid crystal display device to define selected areas where information may be input to the liquid crystal display device prior to the inputting of information to the liquid crystal display device; and
   thereafter inputting information to the liquid crystal display device by the selective depression of a portion of the flexible front substrate associated with a particular activated selected area.

5. A method as set forth in claim 4, wherein the selective depression of a portion of the flexible front substrate is limited as to extent by the underlying body of liquid crystal material to prevent contact of the depressed portion of the flexible front substrate with an opposed interior surface of a component of the liquid crystal display device.

6. A method as set forth in claim 4, further including selecting at least one segment pair in each of the activated selected areas for impedance sensing in which the at least one segment pair selected in each of the activated selected areas is a pair in a non-activated state for the purpose of displaying information.

7. A method as set forth in claim 4, wherein the liquid crystal display device includes a plurality of character display positions, and a plurality of multi-bit digital codes, each of which defines the segments to be actuated and non-actuated in one of said character display positions, and further including: selecting particular ones of said character display positions to be the activated selected areas.

8. A liquid crystal display device capable of receiving input information for affecting a visual output display comprising:
a housing including a flexible front substrate and a rear wall in spaced substantially parallel relation thereto;
conductive segments formed on at least one of said front substrate and said rear wall and adapted to display information;
a body of liquid crystal material contained within said housing and disposed between said front substrate and said rear wall;
said flexible front substrate having sufficient flexibility to deflect toward said rear wall in response to the application of finger tip pressure by a human operator; and
a portion of said flexible front substrate being depressible toward said rear wall in response to the application of downward pressure by a finger tip of a human operator to reduce the thickness of the liquid crystal material disposed between the depressed portion of said front substrate and said rear wall for inputting information to the liquid crystal display by changing the impedance associated with the conductive segment in the area corresponding to the depressed portion of the flexible front substrate.

9. A liquid crystal display device as set forth in claim 8, wherein said rear wall of said housing is a relatively rigid rear substrate of less flexibility than said front substrate.

10. A liquid crystal display device as set forth in claim 9, wherein said conductive segments are provided on each of said front and rear substrates in opposed relationship with respect to each other and in contact with the body of liquid crystal material disposed between said front and rear substrates.

11. A liquid crystal display device as set forth in claim 10, further including impedance-sensing circuit means operatively coupled to said conductive segments for sensing a change in the impedance between at least one pair of said conductive segments in response to the selective depression of a portion of the flexible front substrate corresponding to the area in which said at least one pair of said conductive segments is positioned.

12. A liquid crystal display device as set forth in claim 11, wherein said impedance-sensing circuit means is integrated with said conductive segments on said rear substrate.

13. A liquid crystal display device as set forth in claim 8, wherein any portion of said flexible front substrate which is depressed is limited as to the extent of its movement toward said rear wall to remain in spaced relation with respect to said rear wall, but with a reduced thickness of the liquid crystal material being disposed therebetween.

* * * * *